United States Patent
Faust et al.

(10) Patent No.: US 12,548,730 B2
(45) Date of Patent: Feb. 10, 2026

(54) DISCHARGING AN ELECTROSTATIC CHUCK LOCATED WITHIN A VACUUM CHAMBER

(71) Applicant: APPLIED MATERIALS ISRAEL LTD., Rehovot (IL)

(72) Inventors: Adam Faust, Rehovot (IL); Yosef Basson, Mazkeret-Batya (IL)

(73) Assignee: Applied Materials Israel Ltd., Rehovot (IL)

( * ) Notice: Subject to any disclaimer, the term of this patent is extended or adjusted under 35 U.S.C. 154(b) by 366 days.

(21) Appl. No.: 18/095,951

(22) Filed: Jan. 11, 2023

(65) Prior Publication Data

US 2024/0234078 A1 Jul. 11, 2024

(51) Int. Cl.
*H01J 37/02* (2006.01)
*H01J 37/20* (2006.01)

(52) U.S. Cl.
CPC ............ *H01J 37/026* (2013.01); *H01J 37/20* (2013.01); *H01J 2237/0041* (2013.01); *H01J 2237/2007* (2013.01)

(58) Field of Classification Search
CPC . H01L 21/31; H01L 21/3063; H01L 21/3065; H01L 21/692; H01L 21/6931; H01L 21/6933; H01J 37/026; H01J 37/20; H01J 37/261; H01J 37/32697; H01J 37/32715
USPC ......................................... 361/211–212, 234
See application file for complete search history.

(56) References Cited

U.S. PATENT DOCUMENTS

| | | | |
|---|---|---|---|
| 6,288,357 B1 * | 9/2001 | Dyer ................. | H01L 21/31053 257/E21.244 |
| 7,204,888 B2 | 4/2007 | Tran et al. | |
| 7,430,104 B2 | 9/2008 | Litman et al. | |
| 7,931,776 B2 * | 4/2011 | Itabashi ............ | H01J 37/32935 156/345.55 |
| 9,117,867 B2 | 8/2015 | Hwang et al. | |
| 2004/0188239 A1 * | 9/2004 | Robison ................. | H01J 37/321 257/E21.585 |
| 2004/0233608 A1 * | 11/2004 | Brcka ................. | H01L 21/6833 361/234 |
| 2005/0250340 A1 * | 11/2005 | Chen ................. | H01L 21/02164 438/758 |
| 2006/0291132 A1 * | 12/2006 | Kanno ................ | H01L 21/6831 361/234 |
| 2007/0097580 A1 * | 5/2007 | Brillhart ........... | H01L 21/67109 361/103 |
| 2009/0233450 A1 * | 9/2009 | Sakao ................. | H01L 21/3065 156/345.24 |
| 2010/0050938 A1 * | 3/2010 | Tetsuka .................. | H01J 37/321 118/697 |

(Continued)

*Primary Examiner* — Tuan T Dinh
(74) *Attorney, Agent, or Firm* — Kilpatrick Townsend & Stockton LLP

(57) ABSTRACT

A device for discharging an electrostatic chuck located within a vacuum chamber, the device includes a plasma distribution unit that is configured to receive plasma from an external plasma source that is located outside the vacuum chamber, and perform a distribution of the plasma within the vacuum chamber that discharges the electrostatic chuck. The device also includes a controller for controlling the distribution of the plasma; wherein the distribution of the plasma occurs during a plasma distribution period that is shorter than a duration of a plasma based cleaning process of the electrostatic chuck.

19 Claims, 3 Drawing Sheets

(56) References Cited

U.S. PATENT DOCUMENTS

| | | | | |
|---|---|---|---|---|
| 2010/0208409 | A1* | 8/2010 | Bluck | H01L 21/683 |
| | | | | 361/234 |
| 2013/0323860 | A1* | 12/2013 | Antolik | H01J 37/023 |
| | | | | 156/345.34 |
| 2014/0069584 | A1* | 3/2014 | Yang | H01J 37/32082 |
| | | | | 156/345.44 |
| 2016/0064264 | A1* | 3/2016 | Kulshreshtha | H01L 21/6833 |
| | | | | 438/791 |
| 2017/0062227 | A1* | 3/2017 | Ishikawa | H01J 37/3244 |
| 2020/0066499 | A1* | 2/2020 | Kim | G01J 3/0208 |
| 2020/0161099 | A1* | 5/2020 | Park | H01J 37/32834 |
| 2020/0388518 | A1* | 12/2020 | Mungekar | H01L 21/68 |
| 2021/0340668 | A1* | 11/2021 | Macpherson | C23C 16/0245 |
| 2022/0076933 | A1* | 3/2022 | Scullin | H01J 37/32917 |
| 2022/0181188 | A1* | 6/2022 | Harikai | H01L 21/68742 |

\* cited by examiner

DISCHARGING AN ELECTROSTATIC CHUCK LOCATED WITHIN A VACUUM CHAMBER

BACKGROUND OF THE INVENTION

An electrostatic chuck is used to support a sample that is located within a vacuum chamber of an electron beam evaluation system. Examples of an electron beam evaluation systems include a scanning electron microscope, a transmissive electron microscope, and an electron beam imager.

Additionally or alternatively, charging may occur for various other reasons. The electrostatic chuck is made of an isolating material which may prevent the discharging of the charge aggregated on the electrostatic chuck.

The charge may attract the sample to the electrostatic chuck even when the sample should be released from the electrostatic chuck.

Various prior art methods include opening the vacuum chamber in order to discharge the electrostatic chuck, which is a time-consuming process that also introduced contamination within the vacuum chamber.

There is a growing need to discharge an electrostatic chuck of an electron beam evaluation system without opening the vacuum chamber.

BRIEF SUMMARY OF THE INVENTION

There is provided a device for discharging an electrostatic chuck located within a vacuum chamber, the device may include a plasma distribution unit that is configured to receive plasma from an external plasma source that is located outside the vacuum chamber, and perform a distribution of the plasma within the vacuum chamber that discharges the electrostatic chuck; and a controller for controlling the distribution of the plasma; wherein the distribution of the plasma occurs during a plasma distribution period that is shorter than a duration of a plasma based cleaning process of the electrostatic chuck There is provided a method for discharging an electrostatic chuck located within a vacuum chamber, the method may include receiving, by a plasma distribution unit, plasma from an external plasma source that is located outside the vacuum chamber; performing, by the plasma distribution unit, a distribution of the plasma within the vacuum chamber that discharges the electrostatic chuck; and controlling, by a controller, the distribution of the plasma; wherein the distribution of the plasma occurs during a plasma distribution period that is shorter than a duration of a plasma based cleaning process of the electrostatic chuck.

BRIEF DESCRIPTION OF THE DRAWINGS

The subject matter regarded as the invention is particularly pointed out and distinctly claimed in the concluding portion of the specification. The invention, however, both as to organization and method of operation, together with specimens, features, and advantages thereof, may best be understood by reference to the following detailed description when read with the accompanying drawings in which:

Figure 1:
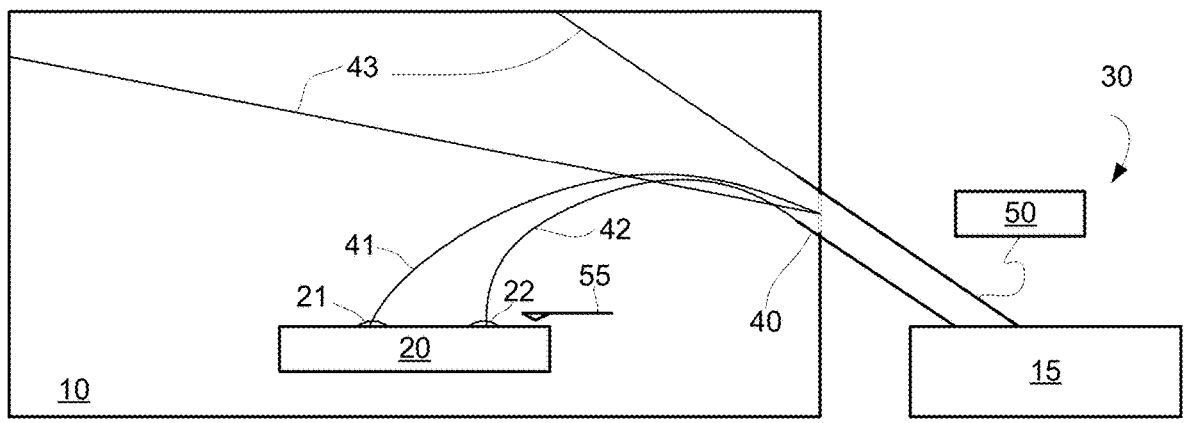
FIG. 1 illustrates an example of a vacuum chamber, an electrostatic chuck and of a device for discharging the electrostatic chuck that is located within the vacuum chamber.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a device capable of executing the method.

Any reference in the specification to a device should be applied mutatis mutandis to a method that may be executed by device.

The term and/or means additionally or alternatively. For example A and/or B means only A, or only B or A and B.

There may be provided a device and a method for discharging an electrostatic chuck by using plasma. The plasma is received from an external plasma source that is external to the vacuum chamber. The discharging process is relatively short, for example may one second, three seconds, five seconds, ten seconds, fifteen seconds, twenty, thirty seconds, less than a minute, less than two minutes, and the like.

The discharging process is shorter than a plasma based cleaning process of the electrostatic chuck that required to scan the entirety of the sample so that plasma radicals may disintegrate contaminations of an unclean electrostatic chuck. The plasma based cleaning process may take more than an hour.

Accordingly—the discharging process can be executed without scanning an entirety of the electrostatic chuck.

The discharging may be executed according to a predefined schedule (for example, in periodical manner) and/or in response to an event such as detecting a charge accumulation in the electrostatic chuck.

FIG. 1 illustrates an example of a vacuum chamber 10, an electrostatic chuck 20 and of a device 30 for discharging the electrostatic chuck 20 that is located within the vacuum chamber 10.

The device 30 includes a plasma distribution unit 40 that is configured to receive plasma from an external plasma source 15 that is located outside the vacuum chamber, and perform a distribution of the plasma within the vacuum chamber. The distribution of the plasma discharges the electrostatic chuck.

Especially, plasma electrons are attracted to positive charges (such as positive charge denoted 21 in FIG. 1) formed on the electrostatic chuck 20, while plasma ions are attracted to negative charges (such as negative charge denoted 22 in FIG. 1) formed on the electrostatic chuck 20.

The device 30 also includes a controller 50 for controlling the distribution of the plasma. The controller 50 may be located within the vacuum chamber or outside the vacuum chamber. The controller may include one or more integrated circuits. The controlling may include, at least determining when to start the distribution of the plasma and when to end the distribution of the plasma. The timings of multiple instances of discharging the electrostatic chuck may be controlled by the controller. The time difference between one instance of discharging and another may well exceed the duration of each instance. For example, the instances may be separated by one to ten hours, by one to ten days, and the like.

The controlling may include requesting or instructing the external plasma source to provide plasma, to stop providing plasma, may include to open or close any value of any plasma distribution element.

The distribution of the plasma occurs during a plasma distribution period that is shorter than a duration of a plasma based cleaning process of the electrostatic chuck.

The plasma distribution unit 40 may be configured to direct the plasma towards an inner portion of the vacuum chamber that is above the electrostatic chuck. The plasma radicals 43 may impinge on that inner portion while plasma electrons 41 and plasma ions 42 may be attracted to the charged form on the electrostatic chuck.

The discharging is aimed to discharge the electrostatic chuck. The discharging may be stopped, under the control of the controller, based on an estimated charging status of the electrostatic chuck, especially performing the discharging until determining or evaluating that the electrostatic chuck is discharged.

The controller may receive charging measurements that are indicative of the charging status of the electrostatic chuck. The charging measurements may be provided by a charging sensor that is part of the device 30. Alternatively, the charging measurements may be provided by a charging sensor that is not a part of the device 30.

FIG. 1 illustrates a charging sensor 55 that is configured to generate charging measurements that are indicative of the charging status of the electrostatic chuck.

The charging sensor may sense the charge at one region of the electrostatic chuck, at more than one region of the electrostatic chuck, at only a part of the electrostatic chuck, or over the entirety of the electrostatic chuck. The charging sensor may measure a capacitance of the electrostatic chuck and deduct the charging status of the electrostatic chuck based on the capacitance.

Figure 2:
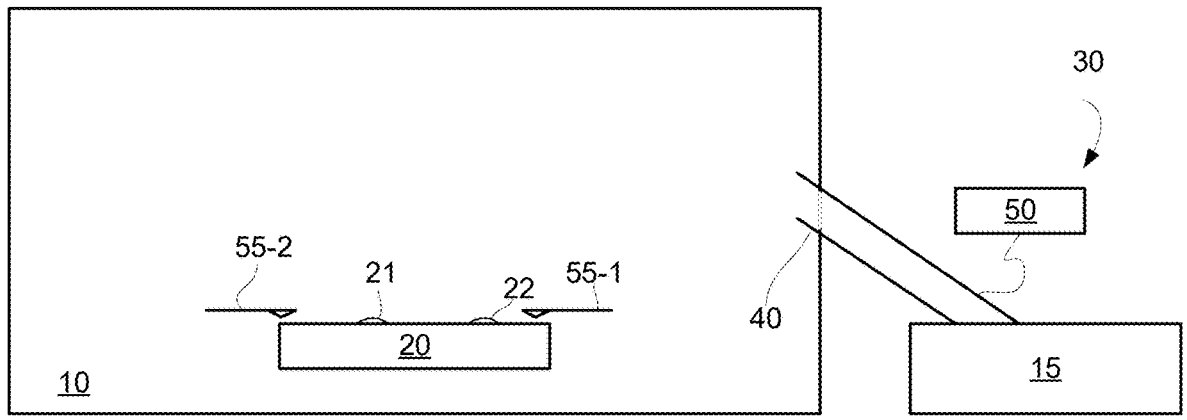
FIG. 2 illustrates an example of a vacuum chamber, an electrostatic chuck and of a device for discharging the electrostatic chuck that is located within the vacuum chamber.

There may be provide multiple charging sensors within the vacuum chamber for sensing the charges at different regions of the electrostatic chuck. Multiple charging sensors 55-1 and 55-2 are illustrated in FIG. 2. There may be any number of charging sensors.

An example of a charging sensor is a Kelvin probe. Other charging sensors can be used.

Figure 3:
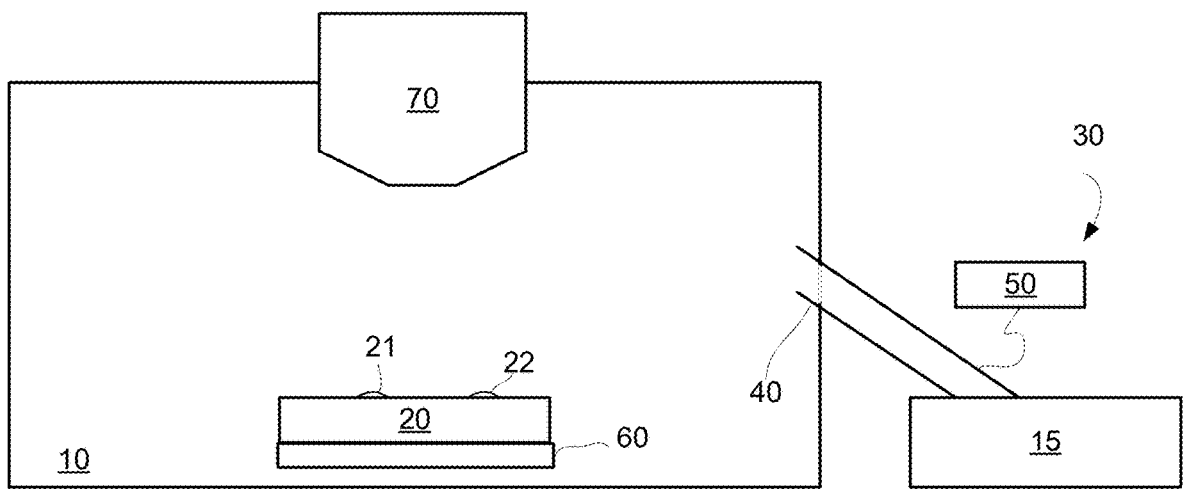
FIG. 3 illustrates an example of a vacuum chamber, an electrostatic chuck and of a device for discharging the electrostatic chuck that is located within the vacuum chamber.

FIG. 3 illustrates a device 30 without any charging sensors. In addition, FIG. 3 illustrates a column 70 of the electron beam evaluation system, and a mechanical stage 60 for moving the electrostatic chuck.

Figure 4:
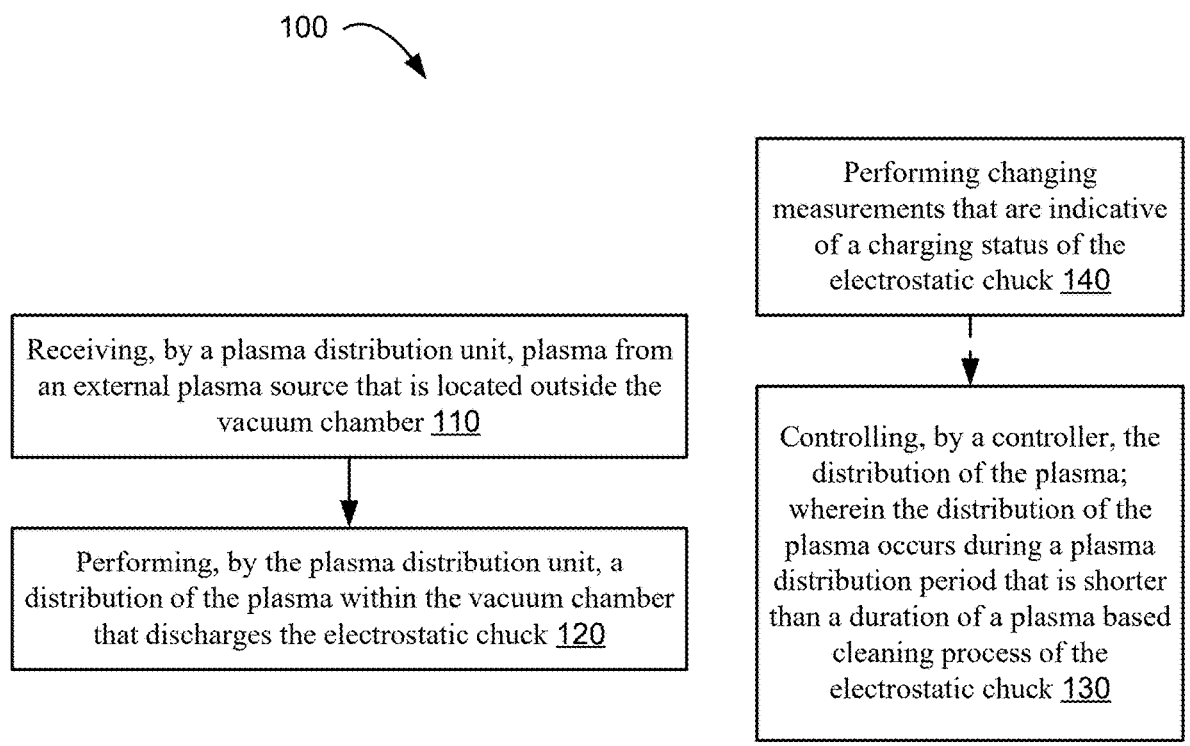
FIGS. 4 and 5 illustrate examples of methods.

FIG. 4 illustrates an example of method 100 for discharging an electrostatic chuck located within a vacuum chamber.

Method 100 may start by step 110 of receiving, by a plasma distribution unit, plasma from an external plasma source that is located outside the vacuum chamber.

Step 110 is followed by step 120 of performing, by the plasma distribution unit, a distribution of the plasma within the vacuum chamber that discharges the electrostatic chuck. Step 120 may be executed without scanning an entirety of the electrostatic chuck.

Steps 110 and 120 may be executed under the control of a controller—as illustrated by step 130 of controlling, by a controller, the distribution of the plasma; wherein the distribution of the plasma occurs during a plasma distribution period that is shorter than a duration of a plasma based cleaning process of the electrostatic chuck.

Step 120 may be executed by directing the plasma towards an inner portion of the vacuum chamber that is above the electrostatic chuck. This allows the plasma ions and the plasma electrons to divert from the trajectory of the plasma radicals and to be attracted to the charged formed on the electrostatic chuck.

Step 130 may be based on an estimated charging status of the electrostatic chuck.

Step 130 may be based on a charging measurement that is indicative of a charging status of the electrostatic chuck.

Method 100 may include step 140 of performing changing measurements that are indicative of a charging status of the electrostatic chuck.

Figure 5:
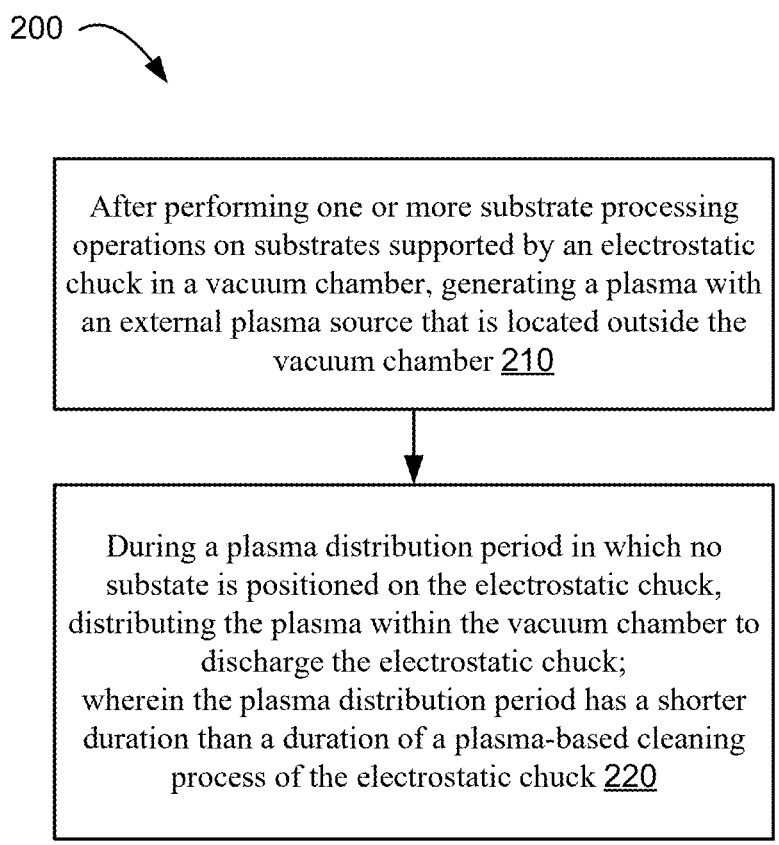

FIG. 5 illustrates an example of method 200 for discharging an electrostatic chuck located within a vacuum chamber (e.g., after performing one or more substrate processing operations on substrates supported by an electrostatic chuck in a vacuum chamber).

Method 200 may start by step 210 of generating a plasma with an external plasma source that is located outside the vacuum chamber as described above with respect to step 110.

Step 210 can be followed by a plasma distribution step 220 in which a plasma is distributed within the vacuum chamber to discharge the electrostatic chuck as described above with respect to step 110. As shown in FIGS. 1-3, during the plasma distribution step no substrate is positioned on the electrostatic chuck.

Steps 210 and 220 may be executed under the control of a controller as discussed above with respect to steps 130 and 140.

In the foregoing specification, the embodiments of the disclosure have been described with reference to specific examples of embodiments. It will, however, be evident that various modifications and changes may be made therein without departing from the broader spirit and scope of the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Any reference to the term "comprising" or "having" or "including" should be applied mutatis mutandis to "consisting" and/or should be applied mutatis mutandis to "consisting essentially of".

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above-described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A device for discharging an electrostatic chuck located within a vacuum chamber, the device comprising:
    a plasma distribution unit that is configured to receive a plasma from an external plasma source that is located outside the vacuum chamber, and perform a distribution of the plasma within the vacuum chamber that discharges the electrostatic chuck; and
    a controller for controlling the distribution of the plasma; wherein the distribution of the plasma occurs during a plasma distribution period in which no substrate is positioned on the electrostatic chuck and that has a duration that is shorter than a duration of a plasma-based cleaning process of the electrostatic chuck.

2. The device according to claim 1 wherein the plasma distribution unit is configured to direct the plasma towards an inner portion of the vacuum chamber that is above the electrostatic chuck.

3. The device according to claim 1 wherein the controller is configured to control the distribution of the plasma based on an estimated charging status of the electrostatic chuck.

4. The device according to claim 1 wherein the controller is configured to control the distribution of the plasma based on a charging measurement that is indicative of a charging status of the electrostatic chuck.

5. The device according to claim 1 further comprising a charging sensor that is configured to perform charging measurements that are indicative of a charging status of the electrostatic chuck.

6. The device according to claim 5 further comprising a Kelvin probe that is configured to perform charging measurements that are indicative of a charging status of the electrostatic chuck.

7. The device according to claim 1 wherein the plasma distribution period does not exceed 1 minute.

8. The device according to claim 1 wherein the plasma distribution period does not exceed 10 seconds.

9. The device according to claim 1 wherein the plasma distribution unit is configured to perform the distribution of the plasma without scanning an entirety of the electrostatic chuck.

10. A method for discharging an electrostatic chuck located within a vacuum chamber, the method comprising:
    receiving, by a plasma distribution unit, a plasma from an external plasma source that is located outside the vacuum chamber;
    performing, by the plasma distribution unit, a distribution of the plasma within the vacuum chamber that discharges the electrostatic chuck; and
    controlling, by a controller, the distribution of the plasma; wherein the distribution of the plasma occurs during a plasma distribution period in which no substrate is positioned on the electrostatic chuck and that has a duration that is shorter than a duration of a plasma-based cleaning process of the electrostatic chuck.

11. The method according to claim 10 wherein the distribution of the plasma comprises directing the plasma towards an inner portion of the vacuum chamber that is above the electrostatic chuck.

12. The method according to claim 10 wherein the controlling is based on an estimated charging status of the electrostatic chuck.

13. The method according to claim 10 wherein the controlling is based on a charging measurement that is indicative of a charging status of the electrostatic chuck.

14. The method according to claim 10 further comprising performing changing measurements that are indicative of a charging status of the electrostatic chuck.

15. The method according to claim 10 wherein the distribution of the plasma is executed without scanning an entirety of the electrostatic chuck.

16. A method for, after performing one or more substrate processing operations on substrates supported by an electrostatic chuck in a vacuum chamber, discharging the electrostatic chuck, the method comprising:
generating a plasma with a plasma source external to the vacuum chamber; and
distributing the generated plasma within the vacuum chamber with a plasma distribution unit such that plasma ions are attracted to an upper surface of the electrostatic chuck to discharge charge that has aggregated on the electrostatic chuck during previous substrate processing operations;
wherein the distribution of the plasma occurs during a plasma distribution period in which no substrate is positioned on the electrostatic chuck and wherein the plasma distribution period has a shorter duration than a duration of a plasma-based cleaning process of the electrostatic chuck.

17. The method according to claim 16 further comprising, after discharging the electrostatic chuck in a first instance by distributing the plasma within the vacuum chamber, waiting at least one hour before initiating a second instance of discharging the electrostatic chuck by repeating the generating and distributing steps.

18. The method according to claim 16 further comprising, after discharging the electrostatic chuck in a first instance by distributing the plasma within the vacuum chamber, waiting at least one day before initiating a second instance of discharging the electrostatic chuck by repeating the generating and distributing steps.

19. The method according to claim 16 wherein, during the distributing step, the plasma is directed towards an inner portion of the vacuum chamber that is above the electrostatic chuck thereby allowing ions and electrons in the plasma to divert from a trajectory of plasma radicals in the plasma and be attracted to charge formed on the electrostatic chuck.

\* \* \* \* \*